United States Patent [19]

Kochanski et al.

[11] Patent Number: 4,660,069

[45] Date of Patent: Apr. 21, 1987

[54] DEVICE WITH CAPTIVATE CHIP CAPACITOR DEVICES AND METHOD OF MAKING THE SAME

[75] Inventors: Ronald P. Kochanski, Arlington Heights; Detlef W. Schmidt, Schaumburg, both of Ill.

[73] Assignee: Motorola, Inc., Schaumburg, Ill.

[21] Appl. No.: 864,751

[22] Filed: May 14, 1986

Related U.S. Application Data

[63] Continuation of Ser. No. 559,560, Dec. 8, 1983.

[51] Int. Cl.[4] .................. H01L 23/48; H01L 23/42; H01L 23/16; H01L 27/02
[52] U.S. Cl. ......................... 357/68; 357/69; 357/79; 357/75; 357/51; 357/34
[58] Field of Search ............ 357/68, 79, 69, 75, 357/51, 34

[56] References Cited

U.S. PATENT DOCUMENTS

| | | | |
|---|---|---|---|
| 2,894,183 | 7/1959 | Fermanian | 357/68 |
| 3,105,922 | 10/1963 | Fukui et al. | 357/75 |
| 3,252,063 | 5/1966 | Ziffer | 357/36 |
| 3,400,310 | 9/1968 | Dorendorf et al. | 357/34 |
| 3,908,102 | 9/1975 | Seike | 200/19 A |
| 4,003,073 | 1/1977 | Helda et al. | 357/69 |
| 4,004,200 | 1/1977 | Johanson | 317/242 |
| 4,151,579 | 4/1979 | Stark | 361/308 |
| 4,158,218 | 6/1979 | McLaurin et al. | 361/308 |
| 4,293,890 | 10/1981 | Varsane | 361/310 |
| 4,489,238 | 12/1984 | Baker | 357/75 |
| 4,598,307 | 7/1986 | Wakabayashi et al. | 357/75 |

Primary Examiner—Martin H. Edlow
Assistant Examiner—Robert P. Limanek
Attorney, Agent, or Firm—Robert J. Crawford

[57] ABSTRACT

A semiconductor device having a plurality of conductive leads extending therefrom is provided for reliably and repeatable positioning and holding a separate electronic device. The conductive leads are disposed apart to provide a predetermined space therebetween. Upstanding sidewall portions of desired dimensions are formed in the conductive leads at a predetermined distance from the central body portion of the semiconductor device. The separate electronic device is inserted in the space between opposite upstanding sidewall portions and is engaged and mechanically held thereby.

5 Claims, 6 Drawing Figures

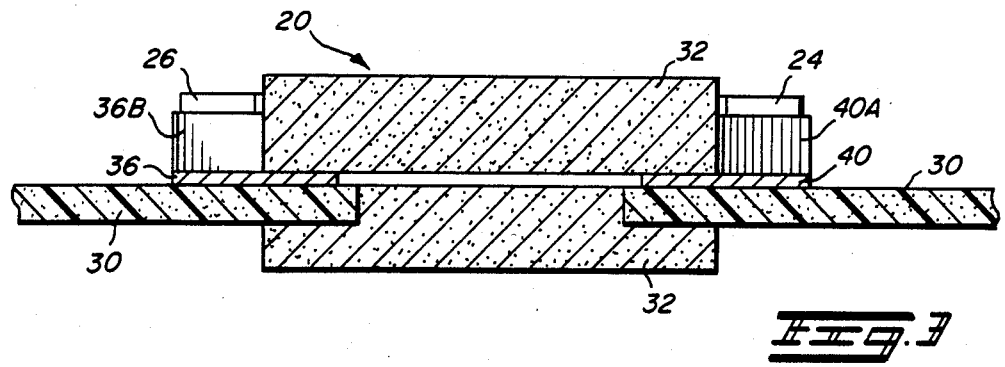
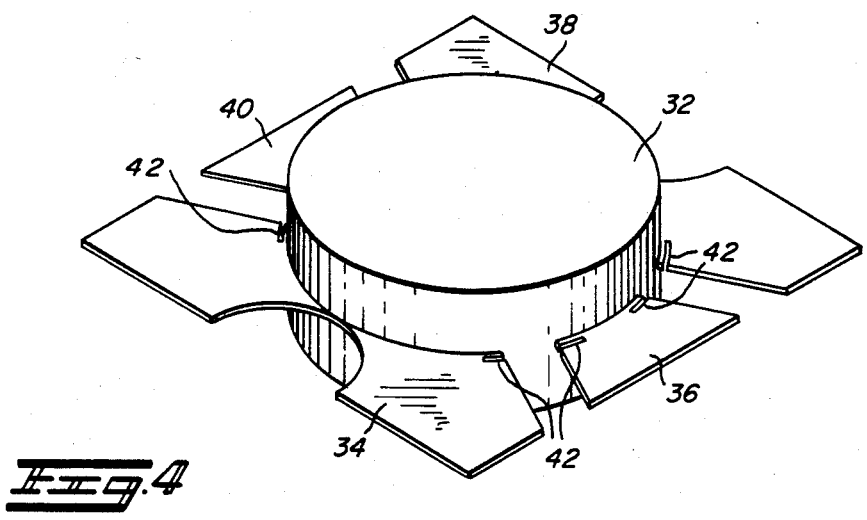
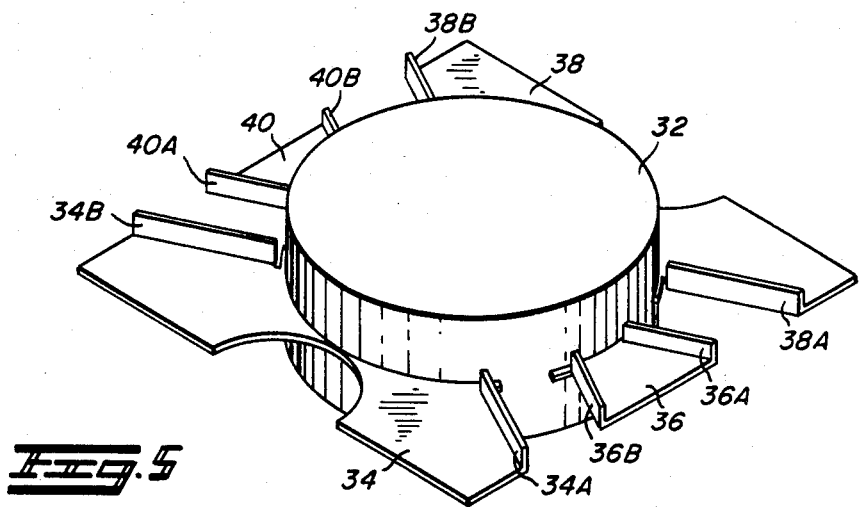

DEVICE WITH CAPTIVATE CHIP CAPACITOR DEVICES AND METHOD OF MAKING THE SAME

This is a continuation of application Ser. No. 559,560, filed 12/8/83.

BACKGROUND OF THE INVENTION

This invention relates to a semiconductor device having conductive leads formed for positioning and retaining a separate component part and, more particularly, to a power transistor having leads formed for positioning and retaining matching chip capacitors relative to the power transistor.

The use of RF matching capacitors in close proximity to an RF power transistor is well known in the prior art. Proper placement of the RF matching capacitors is critical to the electrical performance of the circuit. Hand placement and hand soldering has been employed in the past to physically install RF matching capacitors in close proximity to the RF power transistor. The inaccuracies inherent in the manual operation of hand placement and hand soldering, however, results in sub-optimal electrical performance and unsatisfactory yield.

Alternately, a separate retention clip or soldering fixture has likewise been previously employed for positioning and retaining the chip capacitors at a desired location relative to the RF power transistor. The present invention eliminates the need for a separate retention clip or fixture by forming the leads of the semiconductor device to accurately position and hold the chip capacitor or other electronic device, thereby reducing labor and cost.

SUMMARY OF THE INVENTION

It is accordingly an object of this invention to provide a semiconductor device, itself capable of accurately positioning and holding at least one separate and additional component part.

It is a further object of this invention to eliminate the inaccuracies of manually positioning a separate component part and to eliminate that manual labor.

The invention provides a semiconductor device for positioning and holding a separate component part and a method of making the same. The semiconductor device comprises a central semiconductor body portion having a plurality of essentially rigid conductive leads extending therefrom. Each of the conductive leads includes at least one upstanding sidewall portion being spaced and aligned in a predetermined manner with respect to the central body portion. The upstanding sidewall portions of each of the conduction leads is intended to have a predetermined height and a predetermined length with the conductive leads themselves being cooperatively disposed apart to form a space therebetween whereby the upstanding sidewall portions engage and mechanically hold the separate component part when inserted therebetween. The semiconductor device may be a power transistor having at least one conductive lead separately connected to each of the base, collector and emitter. The separate component part may be a compression mica capacitor which provides RF matching for the power transistor.

BRIEF DESCRIPTION OF THE DRAWINGS

FIG. 3 is a sectional view taken along line 3—3 of FIG. 2; and

FIGS. 4 and 5 are perspective views of the semiconductor device of FIG. 1 before and after the upstanding sidewall portions have been formed, respectively.

DESCRIPTION OF THE PREFERRED EMBODIMENT

Figure 1:
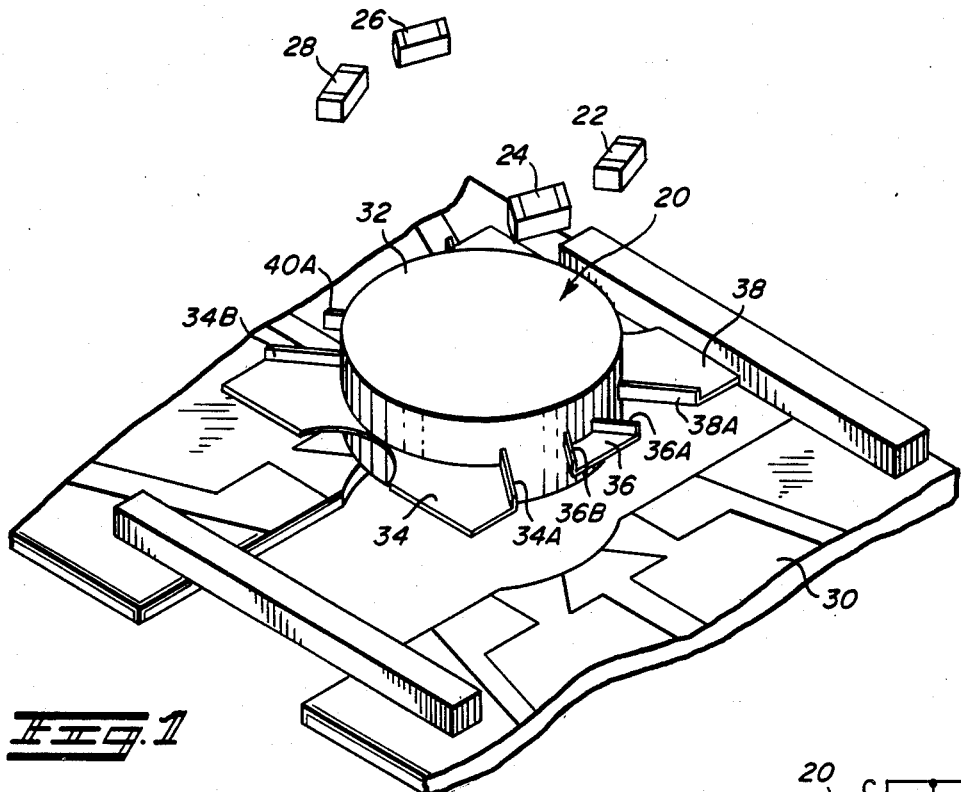
FIG. 1 is an exploded perspective view of the semiconductor device according to the invention, and a printed wiring board and separate component parts.

Referring to FIG. 1, there is shown a semiconductor device according to the invention and designated generally by the reference character 20. A plurality of separate component parts 22, 24, 26 and 28 and a printed wiring board 30 are shown in the exploded perspective view.

The semiconductor device 20 includes a central semiconductor body portion 32 and a plurality of rigid, essentially planar conductive leads 34, 36, 38, 40. Conductive leads 34, 36, 38, 40 extend radially outwardly from the central body portion 32. Each of the conductive leads 34, 36, 38, 40 includes upstanding sidewall portions 34A, 34B, 36A, 36B, 38A, 38B, 40A, 40B that may be formed by bending the edge portions of the leads at substantially a ninety degree angle. The height and length of the upstanding sidewall portions are provided to approximately correspond to the dimensions of the separate component parts 22-28. Adjacent conductive leads, such as e.g. conductive leads 34, 36, are disposed apart to provide a predetermined space therebetween. This predetermined space is such that upstanding sidewall portions 34A, 36B will engage and mechanically hold the separate component part, in this case, part 26, when inserted therebetween. The leads may be composed of any suitable conductive material, such as copper.

The upstanding sidewall portions are formed a predetermined distance from the central body portion 32 according to the desired relative position of the separate component parts 22-28 to the body 32 of the semiconductor device 20.

Figure 2A:
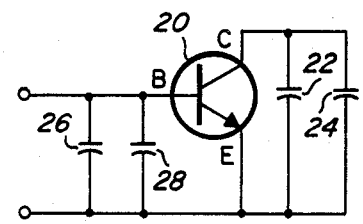
FIG. 2A is a schematic representation of an electrical equivalent of the embodiment shown in FIG. 2.
Figure 2:
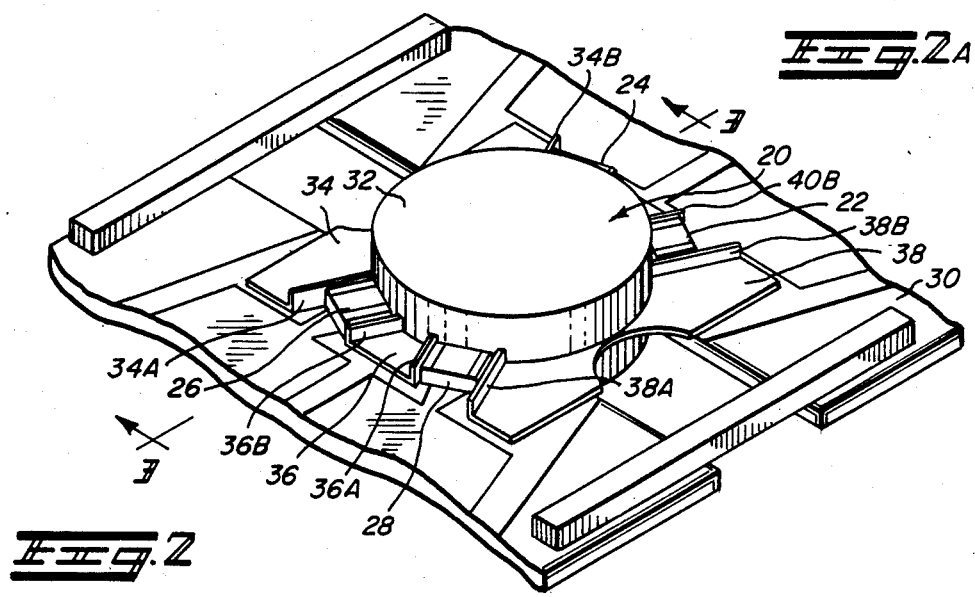
FIG. 2 is a perspective view of the semiconductor device of FIG. 1 attached to the printed wiring board and with the separate component parts inserted and maintained between the leads thereof.

Referring to FIG. 2, there is shown a perspective view of the semiconductor device 20 attached to the printed wiring board 30. The separate component parts 22, 24, 26, 28 are shown inserted in the spaces defined between leads 34, 36, 38, 40. The terminal end portions of the separate component parts engage the upstanding sidewall portions of the conductive leads as illustrated. The terminal end portions may then be secured to the associated upstanding sidewall portions in any known manner, as for example, reflow soldering, conventional soldering, and the like. The ninety degree angle edge of the upstanding sidewall portion supplies a dam for the solder and thereby provides reliable electrical connection.

Referring also to FIG. 2A, there is shown a schematic representation of one possible electrical equivalent of the embodiment shown in FIG. 2. Semiconductor device 20 comprises a power transistor. The emitter of power transister 20 corresponds to leads 34 and 38 that are located at opposite points on the circumference of the power transistor 20. Lead 36 corresponds to the base of power transistor 20 and lead 40 corresponds to the collector.

The separate component parts are matching chip capacitors. Capacitors 26, 28 are provided between the base and emitter of power transistor 20 and capacitors 22, 24 are provided between its collector and emitter. Capacitors 22, 24, 26, 28 serve as RF matching function and for that reason are provided in close proximity to the central body portion 32 of power transistor 20.

Referring now to FIG. 3, there is shown a sectional view taken along line 3—3 of FIG. 2. The semiconductor device 20 is illustrated relative to the printed wiring board 30 and separate component parts 24, 26. The desired height of the upstanding sidewall portions 36B, 40A is shown relative the associated devices 24, 26.

Referring now to FIG. 4, a perspective view of the semiconductor device 20 is shown before the upstanding sidewall portions have been formed in the conductive leads 34, 36, 38, 40. A notch 42 is provided at opposing sides of each conductive leads 34, 36, 38, 40, as shown, and in close proximity to the semiconductor body portion 32. The location of notch 42 relative to the central body portion 32 of the semiconductor device 20 is determined by the particular semiconductor device 20 and separate component parts 22, 24, 26, 28 being employed.

Referring now to FIG. 5, there is shown a perspective view corresponding to the perspective view of the semiconductor device 20 of FIG. 4 after the upstanding sidewall portions have been formed. FIGS. 4 and 5 illustrate a two-stage die approach with a pierce and form method. An alternative method is a one-stage die which shears and forms in one step in a known manner.

In summary, a semiconductor device has been described that has conductive leads formed for positioning and retaining a separate electronic device and a method of making the same.

While a preferred embodiment of the invention has been described in detail, it should be understood that many modifications and variations are possible, all of which can fall within the true spirit and scope of the invention.

What is claimed is:

1. A semiconductor device with fixture means for positioning and holding a plurality of separate and additional component parts in an external predetermined relationship with said semi-conductor device, comprising:
   a central semiconductor body portion having a plurality of rigid conductive leads extending radially outwardly therefrom,
   each of said conductive leads having at least one upstanding sidewall portion being spaced and aligned in a predetermined manner with respect to said central body portion,
   said conductive leads cooperatively being disposed apart to form a space therebetween whereby said upstanding sidewall portions function as fixtures for engaging and mechanically holding a separate component part when inserted therebetween.

2. A semiconductor device according to claim 1 wherein said central semiconductor body portion having a plurality of conductive leads extending therefrom comprises a power transistor.

3. A semiconductor device according to claim 2 wherein at least one of said conductive leads is connected separately to each of the base, collector, and emitter of said power transistor.

4. A semiconductor device according to claim 3 wherein said separate component part is a compression mica capacitor which provides RF matching for said power transistor.

5. A semiconductor device according to claim 4 wherein said compression mica capacitor is provided between the base and emitter and between the collector and emitter of said power transistor.

* * * * *